United States Patent
Sowa et al.

(10) Patent No.: US 11,080,940 B1
(45) Date of Patent: Aug. 3, 2021

(54) EXPORT DECOMPOSITION FILTER FOR A MULTI-USER CAX ENVIRONMENT

(71) Applicant: United Technologies Corporation, Hartford, CT (US)

(72) Inventors: William A. Sowa, Simsbury, CT (US); Andrew D. Milliken, Middletown, CT (US); Joshua Daniel Winn, Ellington, CT (US)

(73) Assignee: RAYTHEON TECHNOLOGIES CORPORATION, Farmington, CT (US)

( * ) Notice: Subject to any disclaimer, the term of this patent is extended or adjusted under 35 U.S.C. 154(b) by 724 days.

(21) Appl. No.: 14/972,141

(22) Filed: Dec. 17, 2015

Related U.S. Application Data

(60) Provisional application No. 62/095,094, filed on Dec. 22, 2014.

(51) Int. Cl.
   *G06T 19/20* (2011.01)
   *G06T 17/10* (2006.01)
   (Continued)

(52) U.S. Cl.
   CPC .............. *G06T 19/20* (2013.01); *G06F 30/00* (2020.01); *G06T 11/001* (2013.01); *G06T 11/80* (2013.01);
   (Continued)

(58) Field of Classification Search
   CPC ......... G06T 19/20; G06T 17/20; G06T 11/80; G06T 11/001; G06T 17/10; G06T 2219/024; G06T 2219/2021; G06F 17/50
   See application file for complete search history.

(56) References Cited

U.S. PATENT DOCUMENTS 8,229,715 B1  7/2012  Teller et al.
8,566,066 B2  10/2013  Thompson et al.
(Continued)

OTHER PUBLICATIONS

Xu, Y., A flexible context architecture for a multi-user GUI, Department of Mechanical Engineering, Brigham Young University, Dec. 2010.
(Continued)

*Primary Examiner* — Tapas Mazumder
(74) *Attorney, Agent, or Firm* — Carlson, Gaskey & Olds, P.C.

(57) ABSTRACT

A system for component visualization according to an exemplary aspect of the present disclosure includes, among other things, a data module configured to access data corresponding to a component design. The component design includes at least one feature corresponding to a group of feature types. A display module is configured to display the data in an environment corresponding to a first user profile. A comparison module is configured to cause the display module to display the at least one feature when the at least one feature meets at least one predetermined criterion relating to the first user profile, and is configured to cause the display module to display a representation of the at least one feature when the at least one predetermined criterion is not met. The representation has a representation geometry that is a different geometry than a feature geometry of the at least one feature. A method for designing a component is also disclosed.

22 Claims, 5 Drawing Sheets

(51) Int. Cl.
*G06T 17/20* (2006.01)
*G06T 11/00* (2006.01)
*G06T 11/80* (2006.01)
*G06F 30/00* (2020.01)

(52) U.S. Cl.
CPC .............. *G06T 17/10* (2013.01); *G06T 17/20* (2013.01); *G06T 2219/024* (2013.01); *G06T 2219/2021* (2013.01)

(56) References Cited

U.S. PATENT DOCUMENTS

| | | | |
|---|---|---|---|
| 2007/0132779 A1* | 6/2007 | Gilbert | G05B 19/0426 345/619 |
| 2009/0060343 A1* | 3/2009 | Rosea | G09C 5/00 382/190 |
| 2012/0317497 A1* | 12/2012 | Red | G06F 17/50 715/751 |
| 2013/0144566 A1 | 6/2013 | De Biswas | |
| 2014/0222387 A1 | 8/2014 | Cannon et al. | |
| 2014/0222919 A1 | 8/2014 | Nysetvold et al. | |

OTHER PUBLICATIONS

Red, E., French, D., Hepworth, A., Jensen, G., Stone, B., Multi-user computer-aided design and engineering software applications, Cloud-Based Design and Manufacturing (CBDM), Springer International Publishing, Jan. 2014.

Red, E., Jensen, G., Ryskamp, J., Mix, K., NxConnect: multi-user CAx on a commercial engineering software application, Department of Mechanical Engineering, Brigham Young University, 2010.

\* cited by examiner

US 11,080,940 B1

EXPORT DECOMPOSITION FILTER FOR A MULTI-USER CAX ENVIRONMENT

CROSS-REFERENCE TO RELATED APPLICATION

The present disclosure claims priority to U.S. Provisional Patent Application No. 62/095,094, filed Dec. 22, 2014.

BACKGROUND

This disclosure relates to computer-aided technologies (CAx), and more particularly, to visualization of component designs in a computing environment.

CAx software is used to develop tools, parts, assemblies, structures and other components using a computer system during the design, analysis, and manufacturing phases, for example. CAx software may be used by a user or group of users to build, analyze, and manufacture complex elements. CAx software is typically restricted to a single user paradigm, wherein only a single user can edit a model or part file within a CAx software application at a time. The user must exit the file before another user is allowed to access it.

SUMMARY

A system for component visualization according to an example of the present disclosure includes a data module configured to access data corresponding to a component design. The component design includes at least one feature corresponding to a group of feature types. A display module is configured to display the data in an environment corresponding to a first user profile. A comparison module is configured to cause the display module to display at least one feature when at least one feature meets at least one predetermined criterion relating to the first user profile, and is configured to cause the display module to display a representation of at least one feature when at least one predetermined criterion is not met. The representation has a representation geometry that is a different geometry than a feature geometry of the at least one feature.

In a further embodiment of any of the foregoing embodiments, the group of feature types includes at least one of a datum, a geometrical shape, a sketch, an extrusion, and a surface feature.

In a further embodiment of any of the foregoing embodiments, the at least one predetermined criterion is at least partially based on the group of feature types.

In a further embodiment of any of the foregoing embodiments, the representation geometry is based on the at least one feature.

In a further embodiment of any of the foregoing embodiments, the at least one feature includes a plurality of features, and the representation geometry is based on a union of the plurality of features.

In a further embodiment of any of the foregoing embodiments, the representation geometry is based on an offset of the at least one feature.

The system as recited in claim 1, comprising a database configured to associate the representation to the at least one feature.

In a further embodiment of any of the foregoing embodiments, the representation is an instance of at least one of the group of feature types.

In a further embodiment of any of the foregoing embodiments, the at least one predetermined criterion is at least partially based on an access list, the first user profile corresponding to the access list.

In a further embodiment of any of the foregoing embodiments, the at least one feature relates to a second user profile corresponding to the access list.

In a further embodiment of any of the foregoing embodiments, the comparison module is configured to cause a second environment corresponding to the second user profile to display at least one visual indicator relating to the representation when the at least one predetermined criterion is met.

In a further embodiment of any of the foregoing embodiments, the at least one visual indicator is an aspect of the representation.

In a further embodiment of any of the foregoing embodiments, a second environment corresponding to the second user profile is configured to execute the comparison module.

In a further embodiment of any of the foregoing embodiments, data corresponding to the at least one feature is stored remotely from a computing platform providing the environment.

In a further embodiment of any of the foregoing embodiments, the predetermined criterion is at least partially based on at least one of the group of feature types, a part identifier, and an assembly identifier each corresponding to the component design.

A system for component visualization according to an example of the present disclosure includes a synchronization module configured to communicate data corresponding to a component design to an environment when at least one feature of the component design meets at least one predetermined criterion, and is configured to communicate a representation of data corresponding to at least one feature when at least one predetermined criterion is not met. The environment corresponds to a user profile. At least one feature corresponds to a group of feature types. The representation has a representation geometry that is a different geometry than a feature geometry of the at least one feature.

In a further embodiment of any of the foregoing embodiments, the user profile and the at least one predetermined criterion correspond to an access list.

A method for designing a component according to an example of the present disclosure includes the steps of displaying on an output device a component design in a first environment, the component design including at least one feature corresponding to a group of feature types, and displaying on the output device at least one feature in the first environment when at least one predetermined criterion is met but displaying a representation of the at least one feature when at least one predetermined criterion is not met, the representation having a different geometry than the at least one feature.

In a further embodiment of any of the foregoing embodiments, the group of feature types includes at least one of a datum, a geometrical shape, a sketch, an extrusion, and a surface feature.

In a further embodiment of any of the foregoing embodiments, the step of displaying is performed in response to modification of the component design by a second environment.

The various features and advantages of this disclosure will become apparent to those skilled in the art from the following detailed description. The drawings that accompany the detailed description can be briefly described as follows.

BRIEF DESCRIPTION OF THE DRAWINGS

The various features and advantages of the disclosed examples will become apparent to those skilled in the art from the following detailed description. The drawings that accompany the detailed description can be briefly described as follows.

DETAILED DESCRIPTION

Figure 1:
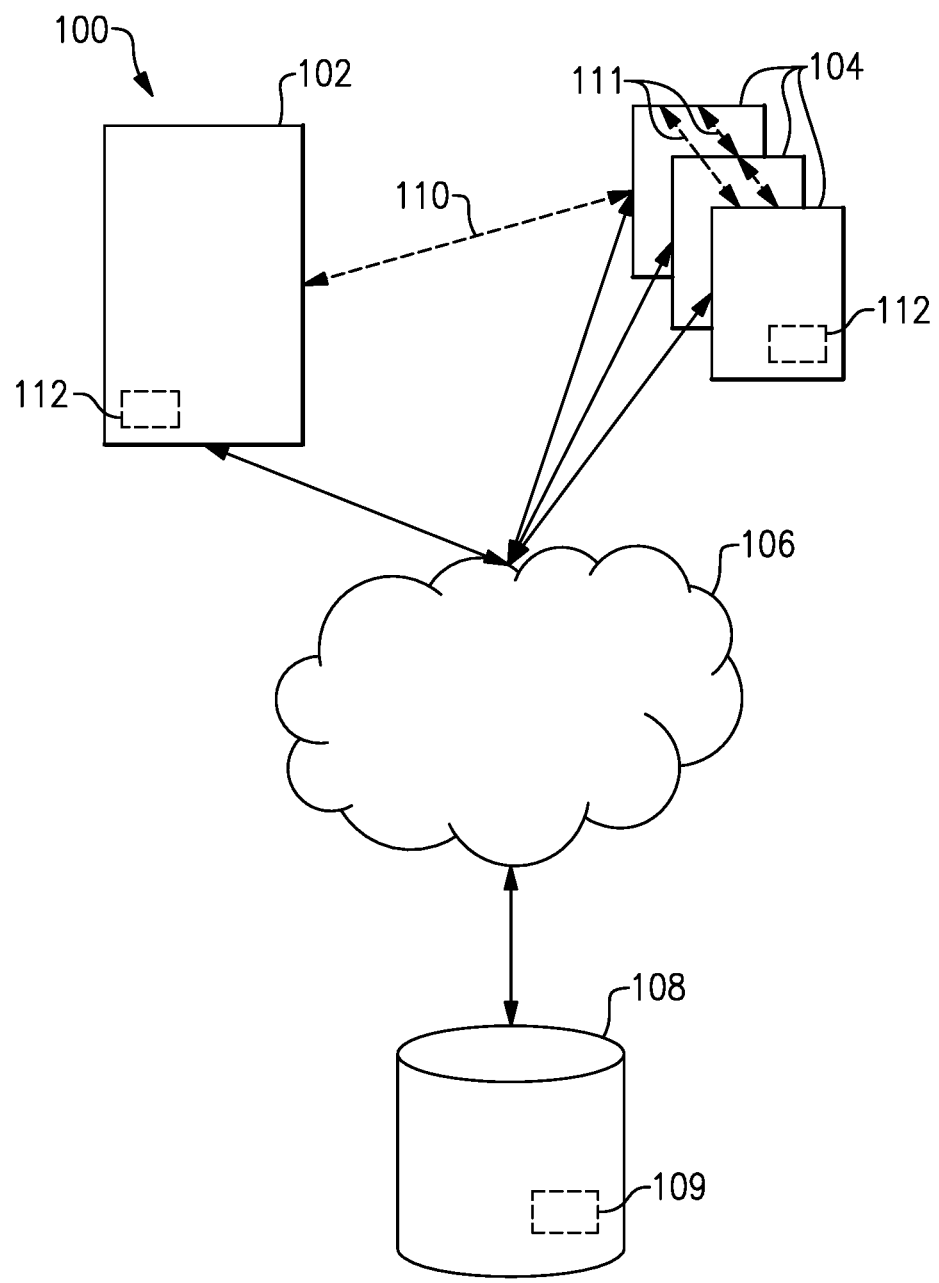
FIG. 1 illustrates a system for a multi-user CAx environment, according to an embodiment.

FIG. 1 illustrates an example computing architecture or system 100 for executing a multi-user CAx environment, according to an embodiment. The system 100 includes a host computer 102. The host computer 102 may include one or more of a computer processor, memory, storage means, network device, and input and/or output devices and/or interfaces. The host computer 102 is configured to execute one or more software programs. In one embodiment, the host computer 102 is more than one computer jointly configured to process software instructions serially or in parallel.

In some embodiments, the host computer 102 is in communication with one or more networks such as a network 106 comprised of one or more computing devices. The system 100 additionally includes one or more client computers 104. The host computer 102 and the one or more client computers 104 typically include one or more of a computer processor, memory, storage means, network device and input and/or output devices and/or interfaces according to some embodiments. The memory may, for example, include UVPROM, EEPROM, FLASH, RAM, ROM, DVD, CD, a hard drive, or other computer readable medium which may store data and/or the CAx software of this description. The host computer 102 and the one or more client computers 104 may be a desktop computer, laptop computer, smart phone, tablet, or any other computer device. In some embodiments, one or more of the host computer 102 and the one or more client computers 104 include an input device, such as a keyboard and mouse, and one or more output devices such as a monitor, speakers, printers, etc. The interface facilitates communication with the other systems and/or components of the network 106.

In some embodiments of collaboration between multiple CAx users, each of the client computers 104 is a user workstation capable of accessing and locally running CAx software and providing a CAx environment 112. In some embodiments, the CAx environment 112 is operable to perform one or more CAx functions including at least one CAx tool, including a computer-aided design (CAD), computer-aided engineering (CAE) and/or computer-aided manufacturing (CAM) tool, for example. In other embodiments, at least one of the client computers 104 is operable to execute different CAx functions. In some embodiments, the CAx environment 112 provides a display or visualization of a component design stored one or more part files, according to one or more visualization settings, and can be provided via one or more graphical user interfaces (GUI).

In some embodiments, the one or more client computers 104 are configured to communicate with the host computer 102 directly via a direct client interface 110 or over the network 106. The one or more client computers 104 are configured to execute one or more software programs, such as a CAx package. In some embodiments, the CAx package is configured to communicate with the host computer 102 either over the network 106 or directly through the direct client interface 110. In another embodiment, the one or more client computers 104 are configured to communicate with each other directly via a peer-to-peer interface 111.

The network 106 may be a private local area network (LAN), a private wide area network (WAN), the Internet, a mesh network, or any other network as is known in the art. The system 100 additionally includes at least one storage system 108, which in some embodiments is operable to store or otherwise provide data to other computing devices. In one embodiment, the storage system 108 is a storage area network device (SAN) configured to communicate with the host computer 102 and/or the one or more client computers 104 over the network 106. In another embodiment, the storage system 108 is located within the host computer 102 or within at least one of the client computers 104. The storage system 108 may be configured to store one or more of computer software instructions, data, CAx files, database files, configuration information, etc.

In some embodiments, the system 100 is a client-server architecture configured to execute computer software on the host computer 102, which is accessible by the one or more client computers 104 using either a thin client application or a web browser executing on the one or more client computers 104. In some embodiments, the host computer 102 loads the computer software instructions from local storage, or from the storage system 108, into memory and executes the computer software using the one or more computer processors.

In some embodiments of the multi-user CAx architecture, each part file is stored within a database 109 at a central location, for instance at storage system 108. In another embodiment, the database 109 is stored at host computer 102 or is a distributed database provided by one or more of the client computers 104. In some embodiments, the database 109 is a relational database, and each part file in the database 109 is associated with a sub-assembly or assembly. In other embodiments, each feature, feature type, part, component design, sub-assembly and assembly corresponds to a unique identifier or database entry. In some embodiments, the database 109 is linked or otherwise corresponds to multiple part files. In an embodiment, the database 109 is configured to store data corresponding the component design one or more database records or entries, rather than linking or otherwise associating one or more part files to the database 109.

Each part file comprises one or more features, each feature corresponding to one or more feature types discussed below. In some embodiments, the part file includes a part tree or another data structure to organize and associate the features in a parent-child relationship between different features and/or part files. Each feature can be applied to one or more base features which together comprise the component design. Although the teachings of this disclosure refer primarily to featured-based CAx tools or systems, it should be appreciated that other CAx tools, systems or environments can benefit from the teachings herein, including geometrical-based CAD models.

The term "feature type" is defined as a geometric or non-geometric operation, or a result of such operation, available in a CAx tool to characterize a component design. The various feature types can be stored in one or more software libraries as one or more data classes which can be instantiated by the CAx tool.

The term "feature" refers to an instance of a feature type, which can include one or more software commands, or a result of its operation (such as a geometric object). Each feature is represented by a data set and has one or more parameters or attributes, such as a unique feature identifier, a feature type, spatial position and orientation, body type such as a wireframe or solid, and/or its hierarchical relation to other features in a part tree, for example.

Some geometric feature types include two-dimensional sketches comprised of one or more one-dimensional geometries, such as points, lines or curves, and two-dimensional geometries such as rectangles or ellipses. A sketch, in some instances, provides a rough approximation of the desired dimensioning of the various aspects of a component design. In yet other embodiments, the feature types include various operations to create or modify solid(s) or other three-dimensional geometry such as wireframes, from one or two dimensional features. These various feature types include extrude(s), revolve(s), loft(s), sweep(s), chamfer(s), boundaries, and meshes, for example. The feature types can include operations such as a Boolean operation to add or subtract one feature from another feature, a mirror or a pattern operation to replicate at least one other feature, and an edge blend operation.

Various non-geometric feature types are contemplated including datum such as point(s), plane(s), axes, and coordinate system(s) utilized to arrange or orient other features, and in some instances may not comprise a final design of the component. Other non-geometric feature types can be used to further characterize a base feature comprising a component design, such as surface shading and coloring, material composition and dimensions. Of course, many other feature types utilized to create and further define the various aspects of a component design are contemplated within the teachings of this disclosure.

These various feature types and corresponding features typically have different levels of relevance to various disciplines involved in the collaboration of a component design. Each feature type and feature can also have different levels of applicability with respect to artifacts of the design process, including two-dimensional drawings such as schematics, engineering drawings or blueprints, wireframe models, surface models, and solid models, and also as inputs to other CAx tools such as finite element analysis (FEA) and computational fluid dynamics (CFD) models.

In some embodiments, the CAx environment 112 is configured to designate one or more features or feature types as a layer. Example layers include sketches, wireframes and solids, which in some embodiments are provided by the CAx software as default layer(s). In other embodiments, a user manually selects feature(s) and/or feature type(s) to be associated with at least one layer. In some embodiments, each layer is defined at system initialization, and in other embodiments, each layer is defined during operation. Each layer is utilized to filter the selected features or feature types in a part file loaded into the CAx environment.

Multiple users each provided with a CAx environment 112 via the client computers 104 are able to simultaneously access each part file stored in the database 109 and are able to view and modify various aspects of a component design corresponding to one or more part files. In some embodiments, the part file is stored locally at the storage system 108, with local copies of the part file at the client computers 104 being synchronized periodically. Modifications to each part file are communicated to each CAx environment 112 currently accessing the part file, either in real-time or periodically utilizing a synchronization scheme. Display or visualization of the modification is therefore made substantially immediately available in CAx environments 112 accessing the same part file, which can assist the multiple users in reducing, identifying/or and resolving conflicts or inconsistencies in various aspects of a component design, thereby ensuring that a particular design intent is met.

In some situations, the multiple users who use a CAx environment 112 are assigned with different level(s) of access to a component design via a user profile. For example, the component design, or various aspects of the component design including the feature(s) or feature type(s), can be associated with one or more of the level(s) of access or permissions. In some embodiments, different levels of access are designated for users that are restricted from accessing various aspects of a component design due to export controls, security classification or proprietary restrictions, for example. Other restricted and unrestricted levels of access are contemplated in this disclosure, including job disciplines and organization structures, for example. Accordingly, it may be desirable to limit access to aspects of a component design depending on the level(s) of access provided to a particular user profile. In some embodiments, each user profile corresponds to one or more access lists setting the level(s) of access for each user profile. Although two levels of access are primarily discussed in this disclosure for illustrative purposes, it should be appreciated that any number of access levels or permissions are contemplated depending on the needs of a particular situation.

Figure 2A:
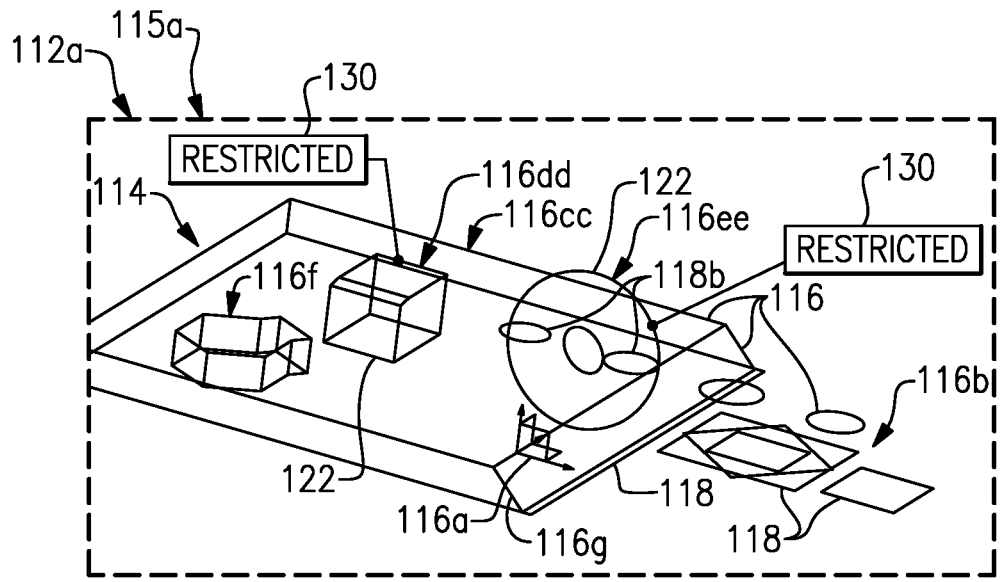
FIG. 2A illustrates a sample component design displayed in a first CAx environment, according to an embodiment.
Figure 2B:
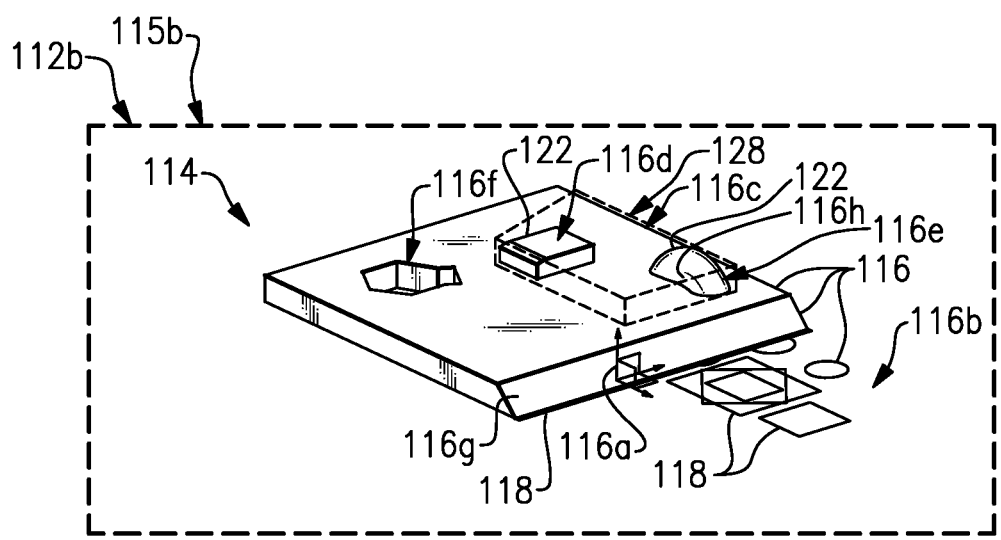
FIG. 2B illustrates the sample component design of FIG. 2A displayed in a second CAx environment, according to an embodiment.

FIGS. 2A-2B illustrate one example in which two users collaborate on various aspects of a component design 114, according to an embodiment. In this embodiment, a first user is provided with a first CAx environment 112a, and a second user is provided with a second CAx environment 112b, shown in FIGS. 2A-2B respectively. Each of the CAx environments 112a, 112b is associated with a different one of the client computers 104, for example.

The example component design 114 includes one or more features 116 each corresponding to a feature type, according to some embodiments. The features 116 shown in FIG. 2A include a datum coordinate system 116a, and a sketch 116b having one or more sketch entities or geometries 118 illustrated as ellipses and rectangles, for example. Some features 116 shown in FIG. 2B include solids such as extrudes 116c, 116d, which are applied to geometries 118 of the sketch 116b and are characterized by wireframes 116cc, 116dd shown in FIG. 2A. Other example features include a hole or Boolean 116f forming an opening in the extrude 116c, and a chamfer 116g applied to extrude 116c. Non-geometric features include surface shading 116h (shown in FIG. 2B) applied to the rotate 116e feature.

Each of the multiple users is able to select one or more visualization settings to characterize the display of the component design 114 in a viewing frustum provided by a CAx environment 112 based on a particular situation, as illustrated in FIGS. 2A-2B. For the purposes of this disclosure, the term "visualization setting" means data corresponding to one or more features, feature types, layers or other parameters which can be utilized to display a component design 114 in a CAx environment 112. The term "viewing frustum" refers to a region of modeling space in a window of the CAx environment 112 modeling the component design 114 that characterizes the display of a model or component design 114, in a graphical user interface (GUI) for example. The viewing frustum is characterized by the spatial position and/or orientation of the component design 114 in the modeling space. The CAx environment 112 displays selected portions of the component design 114 stored in one or more part files based on these visualization setting(s). Accordingly, modifications or updates made by other user(s) to the component design may not be displayed in the CAx environment 112.

FIGS. 2A and 2B illustrate different visualization settings for CAx environments 112a, 112b, according to an embodiment. As illustrated by the CAx environment 112a in FIG. 2A, the user has selected one or more visualization settings to show the wireframe geometries 116cc, 116dd, 116ee and to hide the corresponding solid features 116c, 116d, 116e. In the CAx environment 112b shown in FIG. 2B, the user has selected one or more visualization settings to show solid features 116c, 116d, 116e and to hide wireframes 116c, 116d, 116f, for example. The visualization settings of each CAx environment 112 can be customized according to the needs of a particular situation even though each of the users is working on the same component design 114. Although each user provided with a CAx environment 112 is able to select one or more visualization settings, it may be desirable to limit the ability of a user to access, view and/or edit various aspects of a component design 114, including the ability to query or access a particular memory location, for example.

For illustrative purposes, the CAx environment 112c has the same visualization settings as the second CAx environment 112b. In the illustrative example, the first user provided with the first CAx environment 112a creates or modifies one or more features, such as wireframes 116dd, 116ee. The second user provided with the second CAx environment 112b then creates an extrude 116d characterized by the wireframe 116d and a rotate 116e having a toroid-shaped geometry which is characterized by the wireframe 116ee.

In some examples, each of the users provided with a CAx environment 112 is able to manually select one or more level(s) of access for each component design 114, feature 116, feature type, part file, and/or assembly, for example. In other examples, the one or more level(s) of access is predetermined or otherwise automatically set according to one or more rules.

In the illustrative example, the third CAx environment 112c does not receive or otherwise displays at least one restricted feature 122 designated with one or more restricted levels of access. In one example, the wireframes 116dd, 116ee and the solid features 116d, 116e are designated as restricted features 122. The third CAx environment 112c does not receive and/or display these restricted features 122 because the user profile corresponding to the third CAx environment 112c is designated with a limited access to these restricted features 122 and/or feature types.

Figure 2C:
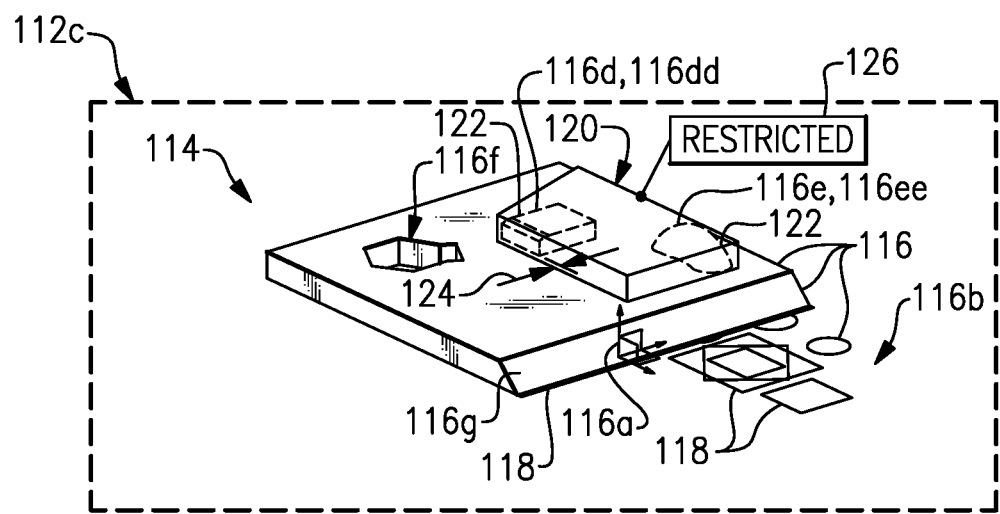
FIG. 2C illustrates the sample component design of FIG. 2A displayed in a third CAx environment, according to an embodiment.

Instead, the third CAx environment 112c displays a shroud or representation 120 based on the wireframes 116dd, 116ee and/or the solid features 116d, 116e (shown in dashed line in FIG. 2C). The representation 120 is characterized by a different geometry than the wireframes 116dd, 116ee and/or the solid features 116d, 116e. The representation 120 reduces the likelihood of disclosing aspects of the restricted features 122 and also reduces the likelihood of design conflicts which might otherwise occur if the representation 120 is not provided.

Various configurations of the shroud or representation 120 are contemplated. In some examples, the level of detail obscured or hidden by the representation 120 depends on the level(s) of access associated with the user profile. In other examples, the level of detail obscured by the representation 120 depends on the particular feature, feature type and/or part file. In some examples, the representation 120 is a union or other combination of the geometries of at least some of the restricted features 122, and in other examples, a different representation 120 is provided for each restricted feature 122. In one example, a portion of the representation 120 is offset a distance 124 from at least one of the restricted features 122 and/or a union of at least some of the restricted features 122. In one example, data corresponding to aspects of the representation 120 is randomly generated to reduce the likelihood of restricted users inferring aspects of the restricted features 122.

Various geometries of the representation 120 are also contemplated, depending on the needs of a particular situation, including two-dimensional geometries and three-dimensional geometries having planar and/or non-planar edges or surfaces. In some examples, the representation 120 includes one or more colored or textured surfaces such as cross-hatching or shading, or another indicator such as label 126 to designate the representation 120 apart from the other features 116 of the component design 114.

In some examples, the representation 120 is an instance of one of the group of feature types. In other examples, the representation 120 is a child feature of at least one of the restricted features 122, and is associated with one or more commands to provide the desired level of obscurity or detail. Data relating to the restricted feature(s) 122 can be mapped to one or more input parameters during creation of the representation 120 to reduce the likelihood of disclosing aspects of the restricted feature(s) 122 to users or profiles with limited access to the component design 114. Separate commands can be associated with the representation 120 to create, modify and/or receive the representation 120, depending on the level(s) of access of a particular profile.

In some examples, the users of the first and second CAx environments 112a, 112b are provided with one or more visual indicators such as labels 130 (shown in FIG. 2A) or an aspect or portion of the representation 120 such as an outline or semi-transparent feature 128 (shown in FIG. 2B), for example. In other examples, the CAx environment 112a, 112b displays the visual indicators when the CAx environment 112c accesses or otherwise displays the component design 114, and otherwise hides the visual indicators from view to simplify a visualization of the component design 114. The visual indicators reduce the likelihood of disclosing aspects of the restricted features 122 to the restricted users during a collaboration session.

Figure 3:
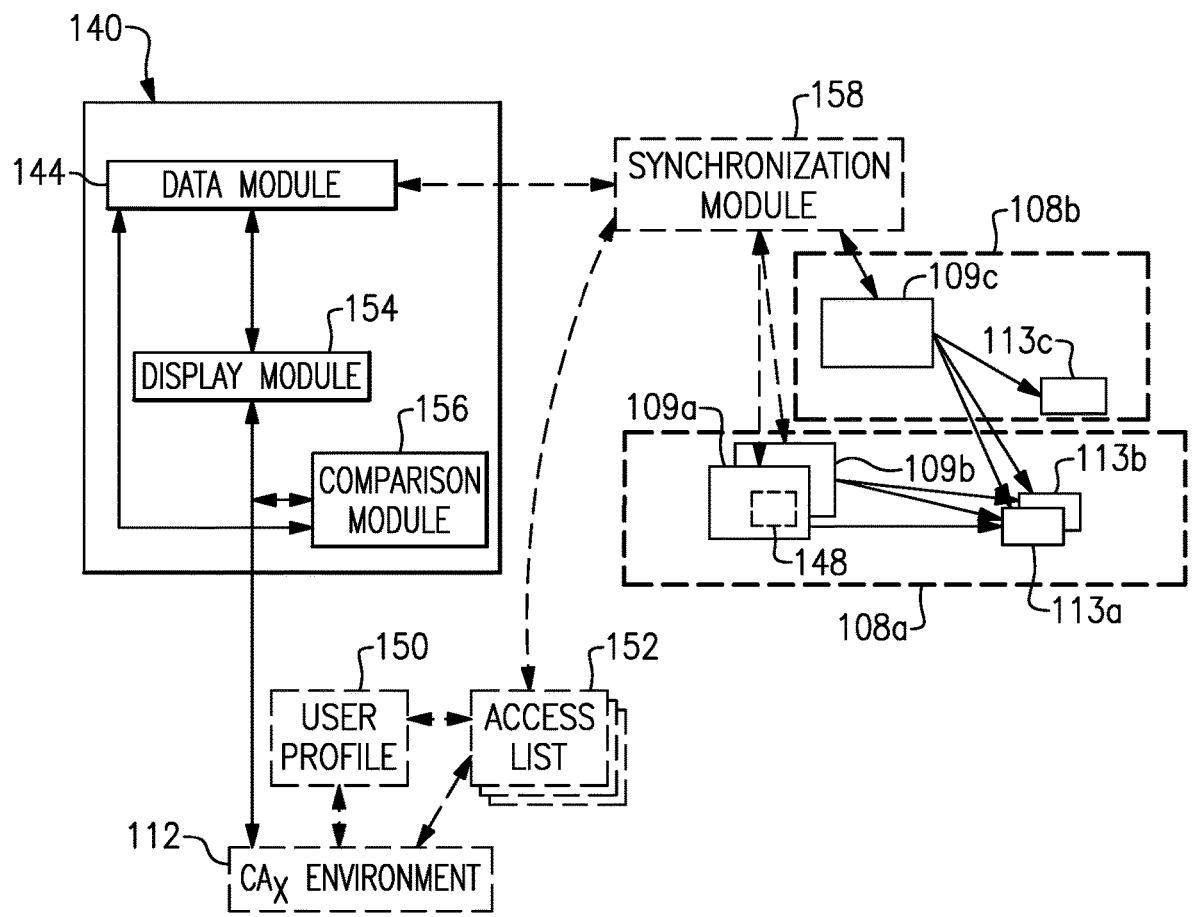
FIG. 3 illustrates a system for component visualization, according to an embodiment.

FIG. 3 illustrates a CAx package 140 for visualization of a component design, according to an embodiment. The CAx package 140 is configured to display data corresponding to at least one part file in a CAx environment, such as one of the CAx environments 112a, 112b, 112c. In some embodiments, the CAx package 140 is provided as a portion of a CAx software tool. In other embodiments, the CAx package 140 is a standalone software program and is configured to interface with a CAx software tool to provide the desired solution. The CAx package 140 can be provided by a tangible or non-transitory computer-readable storage medium and installed at one or more of the client computers 104 and/or the host computer 102, for example. The CAx package 140 includes one or more modules to provide visualization of a component design. Each of these modules includes executable software instructions and/or digital or analog hardware circuitry.

The CAx package 140 includes a data module 144 configured to access one or more part files 113 each comprising data corresponding to a component design. Each part file 113 includes data corresponding to at least one feature, such as any of the feature types discussed in this disclosure. In some examples, the CAx package 140 accesses the part files 113 via one or more databases 109 each linked to one or more of the part file(s) 113. In one example, the databases 109*a*, 109*b* are designated as public or unlimited access databases and database 109*c* is designated as a private or restricted access database. In other examples, at least one database 109 includes at least one partition 148 for storing restricted access data corresponding to various aspects of one or more component designs.

Each database 109 includes one or more tables arranging each component design. The tables include a list of part files 113 linked to a list of features corresponding to a particular component design or part file 113, and a list of feature types corresponding to the features, for example. In some embodiments, the unrestricted access databases 109*a*, 109*b* are stored locally such as at a storage system 108*a*, and the restricted access database 109*c* is stored remotely such as at a storage system 108*b*. In other embodiments, each database 109 is stored locally at a single storage system 108 or another computing device providing a CAx environment 112.

The CAx package 140 also includes a display module 154. The display module 154 is configured to display the data in a CAx environment 112, such as in one of the CAx environments 112*a*, 112*b*, 112*c*.

In some embodiments, a synchronization module 158 controls access to each database 109. The synchronization module 158 is configured to access a particular database 109 in response to querying one or more access lists 152 to determine the level(s) of access of a particular profile requesting and/or sending data corresponding to a component design 114. The user profile 150 corresponds to a physical user, such as a user operating one of the client computers 104, an instance of a CAx environment 112, or a computing device configured to execute a CAx tool, for example.

In some embodiments, the synchronization module 158 is configured to communicate data corresponding to the feature update(s) between two or more CAx environments 112. The synchronization module 158 communicates data corresponding to the feature updates to a CAx environment 112 when the at least one feature meets at least one predetermined criterion, including any of the criteria discussed in this disclosure. The synchronization module 158 communicates data corresponding to a representation of the feature updates to a CAx environment 112 when the at least one predetermined criterion is not met. In one embodiment, the host computer 102 is operable to execute the synchronization module 158. In another embodiment, each of the client computers 104 is operable to execute an instance of a synchronization module 158.

The CAx package 140 includes a comparison module 156 configured to cause the display module 154 to display data corresponding to a component design, such as data in at least one part file 113. In embodiments, the comparison module 156 causes the display module 154 to display data in response to feature modifications or updates to the part file 113 when the part feature(s) meet at least one predetermined criterion. In embodiments, the comparison module 156 causes the display module 154 to display a representation of the at least one feature when the at least one predetermined criterion is not met. The representation includes any of the aspects discussed in this disclosure.

Various criteria are contemplated in this disclosure. In some embodiments, the at least one predetermined criterion relates to a user profile such as the user profile 150. In yet another embodiment, the predetermined criterion is based on the access list 152 corresponding to one or more profiles, such as a user profile 150, or group of user profiles, provided with a CAx environment 112. In one embodiment, the at least one predetermined criterion is met when the user profile 150 has access to the component design 114, or relevant portions of the component design 114 such as particular part files 113, features 116 and/or feature types, each of which may be designated with different levels of access. In another embodiment, the at least one predetermined criterion is based upon at least one feature type, including any of those described in this disclosure. In another embodiment, the at least one predetermined criterion is based on at least one feature of a component design. In another embodiment, the predetermined criterion is based on at least one layer corresponding to at least one feature or featured type. In some embodiments, the at least one predetermined criterion is based on at least one of a part identifier and an assembly identifier, each of which corresponds to a part file or a component design. For example, the assembly identifier may correspond to a group of different parts, each part associated with a part identifier. In some embodiments, the comparison module 156 evaluates the feature update(s) according to more than one predetermined criterion, such as any of those discussed in this disclosure.

Figure 4:
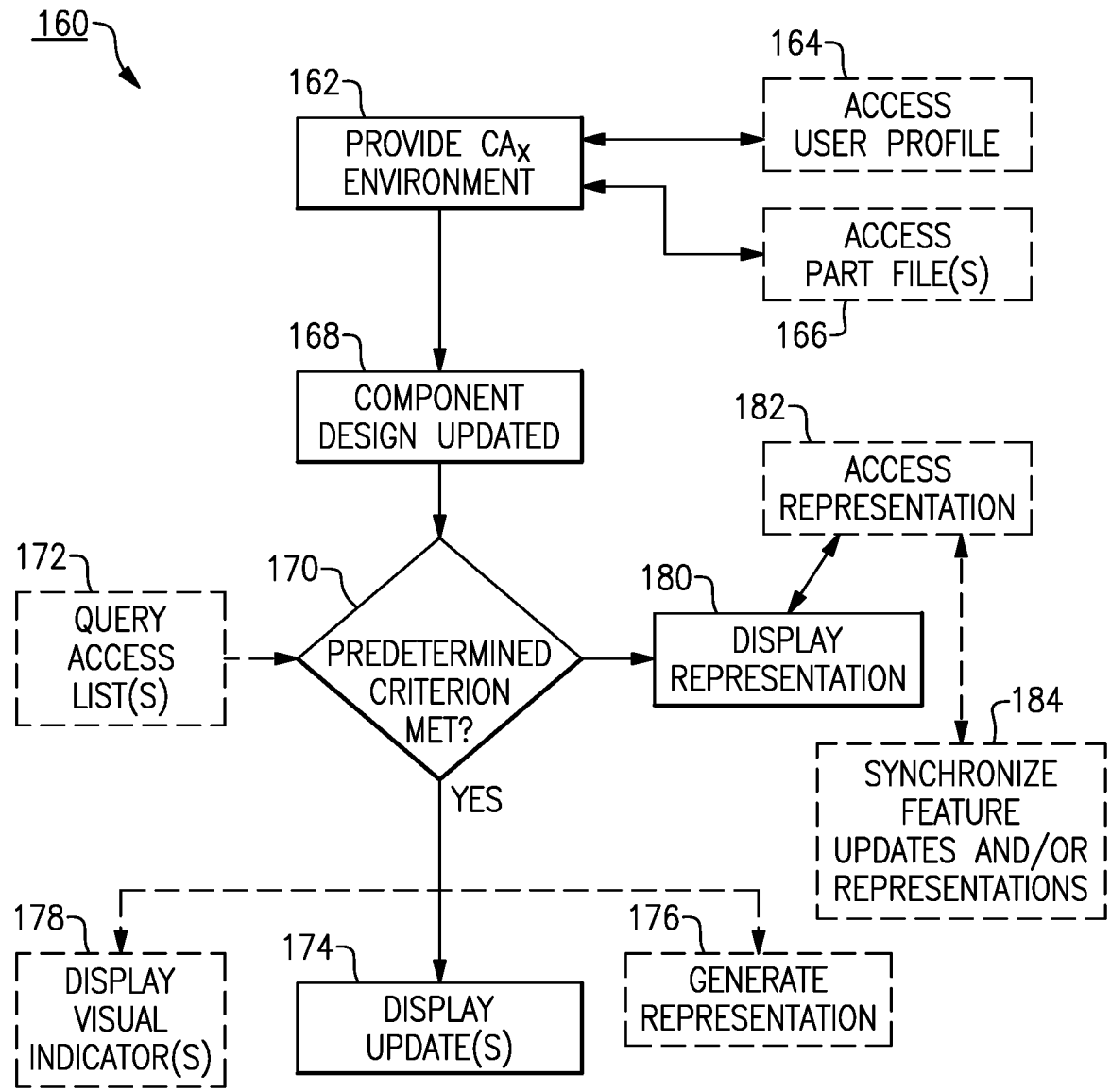
FIG. 4 illustrates a process for sharing updates to a component design between two CAx environments, according to an embodiment.

FIG. 4 illustrates a visualization process or algorithm in a flowchart 160 for synchronizing or otherwise sharing data corresponding to a component design, including updates or modifications to the component design, between two or more CAx environments 112 utilizing any of the techniques described in this disclosure. At block 162 a user accesses a CAx environment. In some embodiments, a user profile is accessed at block 164 and is associated with the CAx environment. In some embodiment, the visualization algorithm 160 accesses one or more part files at block 166, and in other embodiments, creates at least one part file corresponding to a component design. The component design is updated or otherwise modified by a user provided with a CAx environment at block 168. In one embodiment, the modification includes at least one new or modified feature comprising the component design and saved in the part file.

The visualization algorithm 160 evaluates or otherwise determines whether the new or modified feature(s) to the part file(s) meets the at least one predetermined criterion at block 170, including any of the criteria disclosed herein. The at least one predetermined criterion can be set during system configuration, or can be manually selected by a user of a CAx environment, for example. In some embodiments, the visualization algorithm 160 accesses or queries at least one access list at block 172 to determine if the at least one predetermined criterion is met.

At block 174 the visualization algorithm 160 causes the CAx environment to display data corresponding to the feature update(s) when the at least one predetermined criterion is met, utilizing any of the techniques described herein. In some examples, the visualization algorithm 160 generates or otherwise provides data corresponding to a shroud or representation of the feature update(s) when the at least one predetermined criterion is met at block 176, which is stored in a restricted access database, part file, and/or location, for example. In other embodiments, the visualization algorithm 160 causes the CAx environment to display or otherwise provide one or more visual indicators or notifications corresponding to the feature update(s) to the CAx environment when the at least one predetermined criterion is met at block 178.

At block 180 the visualization algorithm 160 causes the CAx environment to display data corresponding to the shroud or representation of the feature update(s) when the at least one predetermined criterion is not met. In some examples, the visualization algorithm 160 accesses data corresponding to the representation at block 182, utilizing any of the techniques described herein. The visualization algorithm 160 reduces the likelihood of disclosure of feature update(s) having limited or restricted access and also reduces the likelihood of design conflicts which might otherwise occur if a visualization of the representation is not provided.

In some embodiments, the visualization algorithm 160 synchronizes the transmission and/or storage of the feature update(s) between one or more CAx environments and one or more databases at block 184, depending on whether the at least one predetermined criterion is met, utilizing any of the techniques of this disclosure.

The visualization algorithm 160 can be programmed in the CAx software directly, provided as one or more software plug-ins adapted to work with the native CAx software, or be provided in a standalone program to interface with a CAx package to provide the desired solution. While the CAx package 140 and the algorithm 160 are described above in the context of a multi-user CAx environment executed on at least one host computer 102 or client computer 104, it should be understood that other CAx tools and architectures may benefit from the teachings of this disclosure. It should also be understood that the host computer 102, client computer 104 or other computing device running the multi-user CAx environment 112 can be programmed with multiple additional tools, and the various features and tools included can be configured to interoperate with each other according to known principles.

Although the discussed examples illustrate a specific component, examples or embodiments of this disclosure are not limited to those particular combinations. One of skill in the art having the benefit of this disclosure will recognize that it is possible to use some of the components or features from one of the examples in combination with features or components from another one of the examples. Furthermore, various embodiments may include one or more examples within them, while other embodiments may include a different subset of examples. In addition, it will be understood that in various embodiments, a module may be a single module, or in some embodiments, the function of a single module may incorporate the features of multiple modules.

Furthermore, the foregoing description shall be interpreted as illustrative and not in any limiting sense. A worker of ordinary skill in the art would understand that certain modifications could come within the scope of this disclosure. For these reasons, the following claims should be studied to determine the true scope and content of this disclosure.

What is claimed is:

1. A system for component visualization, comprising:
a data module configured to access data corresponding to a component design, the component design including at least one feature corresponding to a group of feature types;
a display module configured to display the data in an environment corresponding to a first user profile; and
a comparison module configured to cause the display module to display the at least one feature when the at least one feature meets at least one predetermined criterion relating to the first user profile, but is configured to cause the display module to display a representation of the at least one feature when the at least one predetermined criterion is not met, the representation having a representation geometry that is a different geometry than a feature geometry of the at least one feature.

2. The system as recited in claim 1, wherein the group of feature types includes at least one of a datum, a geometrical shape, a sketch, an extrusion, and a surface feature.

3. The system as recited in claim 1, wherein the at least one predetermined criterion is at least partially based on the group of feature types.

4. The system as recited in claim 1, wherein the representation geometry is based on the at least one feature.

5. The system as recited in claim 4, wherein the at least one feature includes a plurality of features, and the representation geometry is based on a union of the plurality of features.

6. The system as recited in claim 4, wherein the representation geometry is based on an offset of the at least one feature.

7. The system as recited in claim 1, comprising a database configured to associate the representation to the at least one feature.

8. The system as recited in claim 1, wherein the representation is an instance of at least one of the group of feature types.

9. The system as recited in claim 1, wherein the at least one predetermined criterion is at least partially based on an access list, the first user profile corresponding to the access list.

10. The system as recited in claim 9, wherein the at least one feature relates to a second user profile corresponding to the access list.

11. The system as recited in claim 10, wherein the comparison module is configured to cause a second environment corresponding to the second user profile to display at least one visual indicator relating to the representation when the at least one predetermined criterion is met.

12. The system as recited in claim 11, wherein the at least one visual indicator is an aspect of the representation.

13. The system as recited in claim 10, wherein a second environment corresponding to the second user profile is configured to execute the comparison module.

14. The system as recited in claim 1, wherein data corresponding to the at least one feature is stored remotely from a computing platform providing the environment.

15. The system as recited in claim 1, wherein the predetermined criterion is at least partially based on at least one of the group of feature types, a part identifier, and an assembly identifier each corresponding to the component design.

16. The system as recited in claim 15, wherein the representation geometry is offset a distance from the at least one feature.

17. A system for component visualization, comprising:
a database that stores a component design; and
a synchronization module configured to communicate data corresponding to the component design to an environment when at least one feature of the component design meets at least one predetermined criterion, but is configured to communicate a representation of data corresponding to the at least one feature when the at least one predetermined criterion is not met, the environment corresponding to a user profile, the at least one feature corresponding to a group of feature types, and the representation having a representation geometry that is a different geometry than a feature geometry of the at least one feature.

18. The system as recited in claim 17, wherein the user profile and the at least one predetermined criterion correspond to an access list.

19. A method for designing a component, comprising the steps of:
   a) displaying on an output device a component design in a first environment, the component design including at least one feature corresponding to a group of feature types;
   b) displaying on the output device the at least one feature in the first environment when at least one predetermined criterion is met but displaying a representation of the at least one feature when the at least one predetermined criterion is not met, the representation having a different geometry than the at least one feature.

20. The method of claim 19, wherein the group of feature types includes at least one of a datum, a geometrical shape, a sketch, an extrusion, and a surface feature.

21. The method of claim 19, wherein the step of displaying is performed in response to modification of the component design by a second environment.

22. The method as recited in claim 19, wherein the step of displaying on the output device includes randomly generating data corresponding to an aspect of the representation such that the different geometry obscures a level of detail of a feature geometry of the at least one feature.

* * * * *